(12) United States Patent
Ishikawa et al.

(10) Patent No.: US 9,837,979 B2
(45) Date of Patent: Dec. 5, 2017

(54) ELECTRONIC DEVICE, CIRCUIT SUBSTRATE FOR ELECTRONIC DEVICE, ELECTRONIC APPARATUS, AND MOVING OBJECT

(71) Applicant: Seiko Epson Corporation, Tokyo (JP)

(72) Inventors: Masayuki Ishikawa, Suwa (JP); Seiichi Chiba, Minowa (JP)

(73) Assignee: Seiko Epson Corporation (JP)

( * ) Notice: Subject to any disclaimer, the term of this patent is extended or adjusted under 35 U.S.C. 154(b) by 514 days.

(21) Appl. No.: 14/534,622

(22) Filed: Nov. 6, 2014

(65) Prior Publication Data

US 2015/0123514 A1 May 7, 2015

(30) Foreign Application Priority Data

Nov. 7, 2013 (JP) .................................. 2013-230947

(51) Int. Cl.
*H03H 9/10* (2006.01)
*H03H 9/05* (2006.01)

(52) U.S. Cl.
CPC .......... H03H 9/1021 (2013.01); H03H 9/0552 (2013.01)

(58) Field of Classification Search
CPC ...... H01L 41/053; H03H 9/1021; H03H 9/05; H03H 9/0514; H03H 9/15; H03H 9/17; H03H 9/19

USPC ......................................... 310/340, 344, 348
See application file for complete search history.

(56) References Cited

U.S. PATENT DOCUMENTS

| 6,229,404 | B1 * | 5/2001 | Hatanaka | ................ | H03B 5/04 |
| | | | | | 257/698 |
| 2010/0060367 | A1 | 3/2010 | Harima et al. | | |
| 2011/0114353 | A1 * | 5/2011 | Iizuka | ................... | H01L 23/053 |
| | | | | | 174/50.5 |

FOREIGN PATENT DOCUMENTS

| JP | 2000-077941 A | 3/2000 |
| JP | 2000-077942 A | 3/2000 |
| JP | 2000-077943 A | 3/2000 |
| JP | 2009-239413 A | 10/2009 |
| JP | 2010-178170 A | 8/2010 |
| JP | 2013-207512 A | 10/2013 |
| WO | WO-2008-136340 A1 | 11/2008 |

* cited by examiner

*Primary Examiner* — Derek Rosenau
(74) *Attorney, Agent, or Firm* — Harness, Dickey & Pierce, P.L.C.

(57) ABSTRACT

An electronic device includes a first conductive pattern and a second conductive pattern that are disposed on a main surface of an insulating substrate, a first electrode pattern that is electrically connected to the first conductive pattern, and a vibrator element that is disposed on the main surface, and the area of a first section in which the first conductive pattern overlaps the first electrode pattern is greater than the area in which the other conductive pattern overlaps the first electrode pattern in a plan view.

10 Claims, 11 Drawing Sheets

ELECTRONIC DEVICE, CIRCUIT SUBSTRATE FOR ELECTRONIC DEVICE, ELECTRONIC APPARATUS, AND MOVING OBJECT

BACKGROUND

1. Technical Field

The present invention relates to an electronic device including a circuit substrate, a circuit substrate for an electronic device, an electronic apparatus, and a moving object.

2. Related Art

As an electronic device of the related art, for example, a crystal oscillator having a so-called double-sided mountable structure in which a quartz crystal vibrator element (piezoelectric vibration element) is provided on a surface of a substrate section, and a quartz crystal terminal (mount pad) that is electrically connected to the quartz crystal vibrator element and an electronic component (integrated circuit element) that is electrically connected to the quartz crystal terminal are provided on a back surface thereof as described in JP-A-2010-178170 is known.

In the crystal oscillator, in response to the requirement for reduction in size, a smaller electronic component has been used, and also the mounting surface of the circuit substrate has been designed to have a small area.

The electronic component is mounted on, for example, the circuit substrate, and is connected to the quartz crystal terminal through metal bumps. Generally, the advancement of techniques for reducing the area of metal bump disposition has been slower than the advancement of integration techniques.

Therefore, in the crystal oscillator, the proportion of the area of the quartz crystal terminal in the area of the circuit substrate is likely to increase as the reduction in size thereof proceeds.

Additionally, in the case of the crystal oscillator having the double-sided mountable structure, when the electrical characteristics of the quartz crystal vibrator element are checked, a probe pin is brought into contact with the quartz crystal terminal, and therefore the area of the quartz crystal terminal is greater than the area of other mount pads.

Meanwhile, the same number of quartz crystal terminals as the number of excitation electrodes in the quartz crystal vibrator element are prepared, and are disposed at preferable positions in consideration of the ease of contact with the probe pin and a countermeasure for the floating capacitance between a print substrate and the quartz crystal terminal that are mounted on the crystal oscillator.

However, in the crystal oscillator described in JP-A-2010-178170, the floating capacitance between the quartz crystal terminal and the excitation electrodes is not taken into account.

As the floating capacitance, for example, an equivalent parallel capacitance $C_0$ that is generated between both electrodes in the quartz crystal vibrator element through the quartz crystal terminal may be used, and there has been a case in which, as the value thereof increases, the electrical characteristics of the electronic device deteriorate.

Particularly, since the progress in the reduction in size of the crystal oscillator also makes the substrate section thinner, the distance between the quartz crystal terminal and the excitation electrode decreases, and the floating capacitance is likely to increase.

SUMMARY

An advantage of some aspects of the invention is to solve at least a part of the problems described above, and the invention can be implemented as the following forms or application examples.

Application Example 1

This application example is directed to an electronic device including: an insulating substrate including a first main surface and a second main surface, which are in a front and back relationship; a first conductive pattern and a second conductive pattern that are disposed on the second main surface; and a vibrator element that includes a vibrator element substrate, a first electrode pattern that is present on one surface of the vibrator element substrate, faces the first main surface, and is electrically connected to the first conductive pattern, and a second electrode pattern that is disposed on the other surface of the vibrator element substrate, the vibrator element being disposed on the first main surface, in which, in a plan view, the first conductive pattern includes a first section in which the first conductive pattern overlaps the first electrode pattern, and an area of the first section is greater than an area in which the second conductive pattern overlaps the first electrode pattern in a plan view.

According to this application example, in the first section, the first electrode pattern and the first conductive pattern that face each other are electrically connected to each other, and the area of the first section is greater than the area in which the first electrode pattern and the second conductive pattern overlap each other. Therefore, between the first electrode pattern and the second conductive pattern, while a parasitic capacitance is easily generated, the proportion of a region in which the parasitic capacitance is not easily generated in a region of the first electrode pattern is increased, and thus it is possible to improve the electrical characteristics of the electronic device.

Application Example 2

It is preferable that the electronic device according to the application example described above further includes an electronic component that is overlapped by at least the first conductive pattern and is disposed on the second main surface, in which, in a plan view of the first section through the electronic component, the first section is covered with the electronic component, and the area of the first section is greater than an area in which the second conductive pattern is overlapped by the first electrode pattern and the electronic component.

According to this application example, in addition to the above-described effect, even when the vibrator element fluctuates, and the distance between the vibrator element and the electronic component changes, the change in the floating capacitance is small in the region of the first section. In addition, the proportion of the area of the first section is greater than the area in which the second conductive pattern is overlapped by the first electrode pattern and the electronic component, and thus it is possible to improve the electrical characteristics of the electronic device.

Application Example 3

In the electronic device according to the application example described above, it is preferable that the electronic component includes an analog circuit and a digital circuit, and an area in which the first conductive pattern overlaps the digital circuit is preferably greater than an area in which the first conductive pattern overlaps the analog circuit.

According to this application example, in addition to the above-described effect, even when the area is great, the proportion of the first conductive pattern overlapping the digital circuit that is not easily influenced by a signal supplied from the first conductive pattern through the parasitic capacitance is large, and thus it is possible to improve the electrical characteristics of the electronic device.

Application Example 4

In the electronic device according to the application example described above, it is preferable that the insulating substrate has a single-layer structure at least in a place in which the insulating substrate overlaps the first section.

According to this application example, in addition to the above-described effect, it is possible to improve the electrical features of the electronic device with respect to the floating capacitance in the insulating substrate having a single-layer structure in which a shield conductive layer cannot be interposed into the insulating substrate.

Application Example 5

This application example is directed to an electronic apparatus including the electronic device according to the application example described above.

According to this application example, by the above-described effect, it is possible to realize an electronic apparatus having excellent performance.

Application Example 6

This application example is directed to a moving object including the electronic device according to the application example described above.

According to this application example, by the above-described effect, it is possible to realize a moving object having excellent performance.

Application Example 7

This application example is directed to a circuit substrate for an electronic device including: an insulating substrate including a first main surface and a second main surface, which are in a front and back relationship; a first conductive pattern and a second conductive pattern that are disposed on the second main surface, are electrically connected to a vibrating element disposed on the insulating substrate, and are electrically connected to an electronic component disposed on the second main surface, in which the first conductive pattern and the second conductive pattern are disposed in a region of the second main surface covered with the electronic component in a plan view, and an area of the second conductive pattern is smaller than an area of the first conductive pattern.

According to this application example, in a case in which there is a permissible difference in the value of the parasitic capacitance that can be given to a terminal of an electronic component mounted on a circuit substrate for an electronic device, it is possible to cope with the permissible difference.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, exemplary embodiments of the invention will be described with reference to the accompanying drawings. Meanwhile, in the following drawings, the dimensions of individual layers or individual members will be made to be different from the actual dimensions to enlarge the individual layers or individual members so as to be recognizable.

Embodiment 1

Figure 1A:
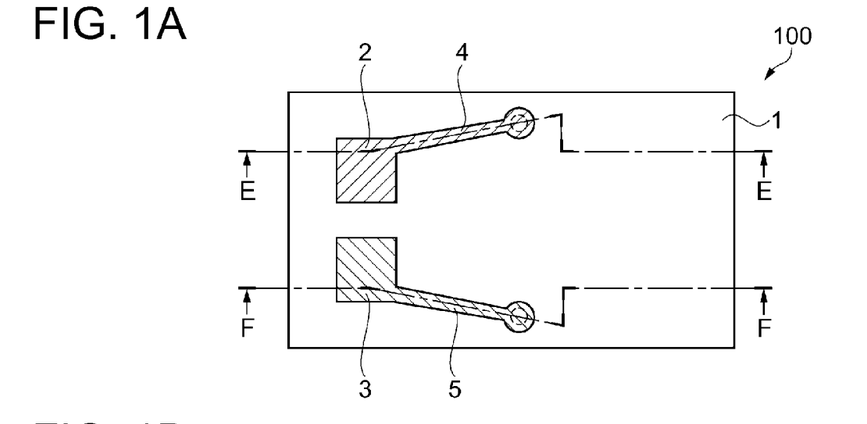
FIGS. 1A to 1D are views of a circuit substrate for an electronic device according to Embodiment 1.
Figure 1B:
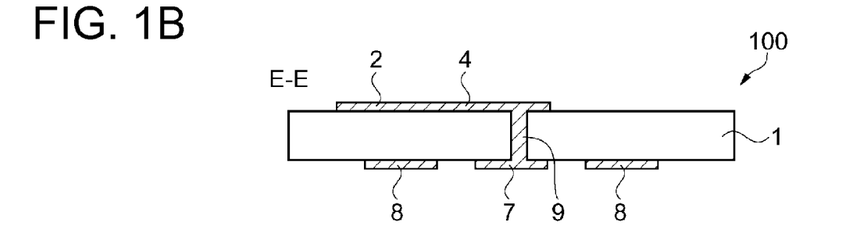
Figure 1C:
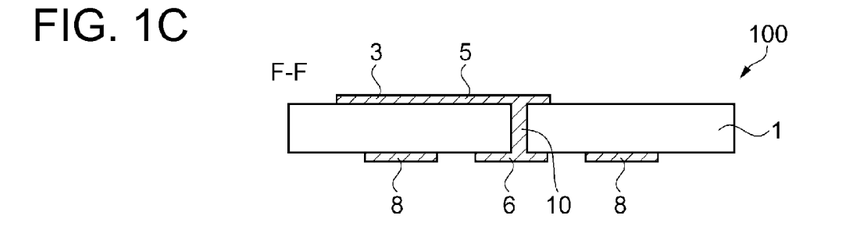
Figure 1D:
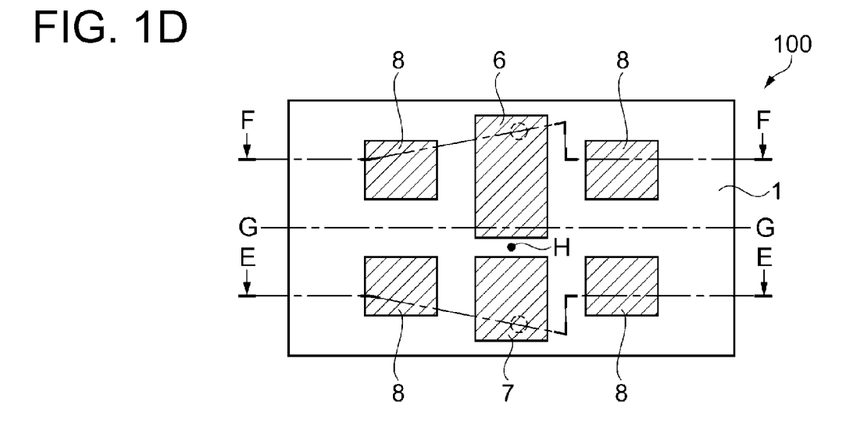

FIGS. 1A to 1D are views illustrating a circuit substrate for an electronic device according to Embodiment 1, FIG. 1A is a plan view of a first main surface, FIG. 1B is a cross-sectional view taken along the line E-E in FIG. 1A, FIG. 1C is a cross-sectional view taken along the line F-F in FIG. 1A, and FIG. 1D is a plan view of a second main surface.

Figure 2A:
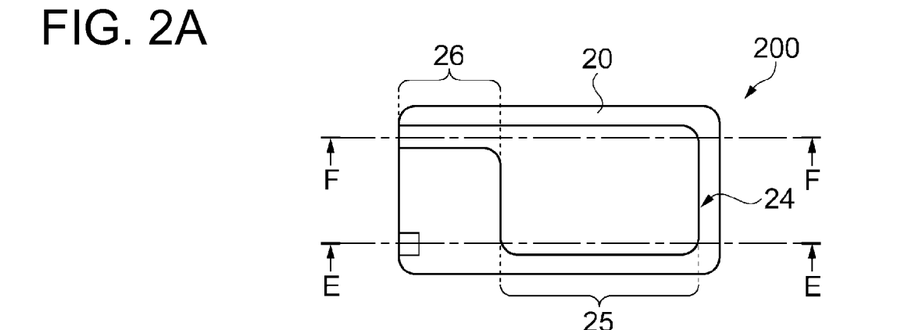
FIGS. 2A to 2D are views of a vibrator element according to Embodiment 1.
Figure 2B:
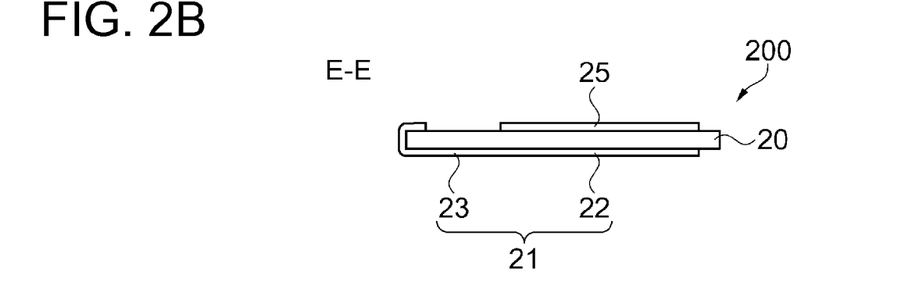
Figure 2C:
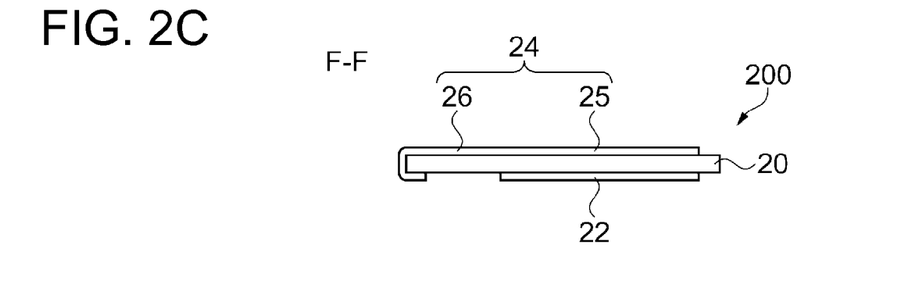
Figure 2D:
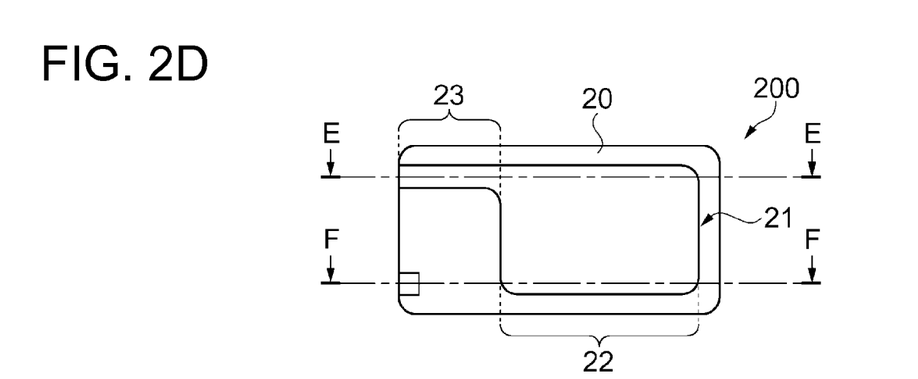

FIGS. 2A to 2D are views illustrating a vibrator element, and FIG. 2A is a plan view of a second surface (the other surface). FIG. 2B is a cross-sectional view taken along the line E-E in FIG. 2A, FIG. 2C is a cross-sectional view taken along the line F-F in FIG. 2A, and FIG. 2D is a plan view of a first surface (one surface) which is on the opposite side to the second surface in FIG. 2A.

Figure 3A:
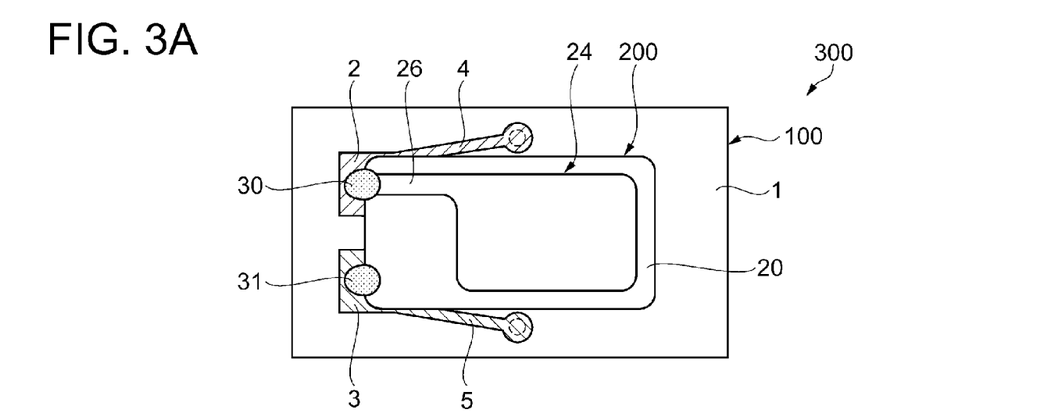
FIGS. 3A to 3D are views of an electronic device according to Embodiment 1.
Figure 3B:
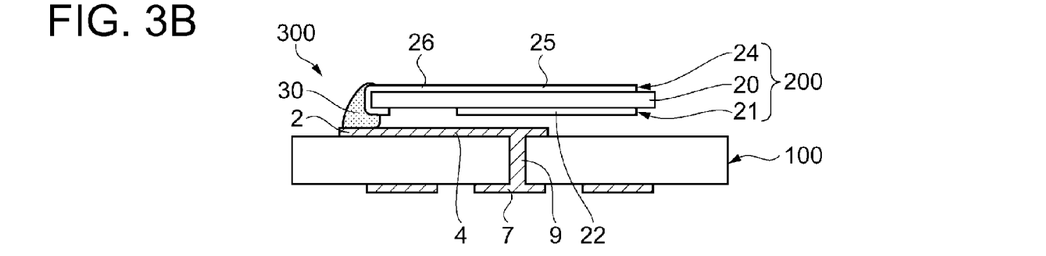
Figure 3C:
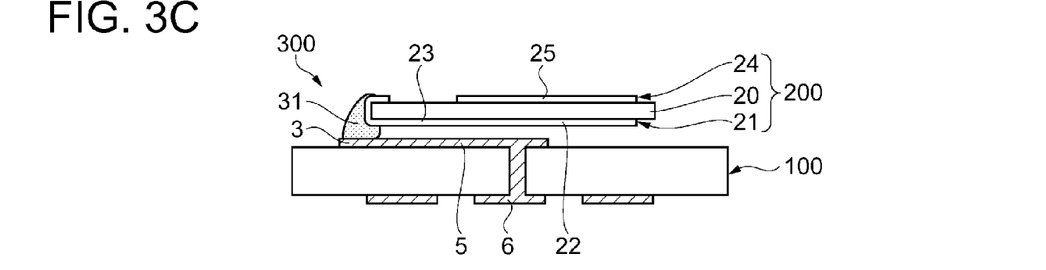
Figure 3D:
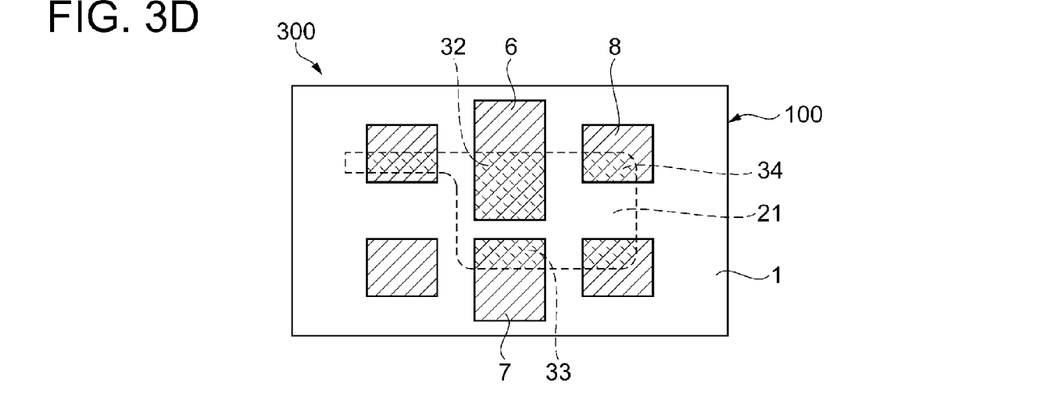

FIGS. 3A to 3D are views illustrating an electronic device. FIG. 3A is a plan view of a circuit substrate for an electronic device seen from a first main surface side, and FIG. 3B is a cross-sectional view which illustrates the cross-section illustrated in FIG. 1B of the circuit substrate for an electronic device, and illustrates the cross-section illustrated in FIG. 2C of the vibrator element. FIG. 3C is a cross-sectional view which illustrates the cross-section illustrated in FIG. 1C of the circuit substrate for an electronic device, and illustrates the cross-section illustrated in FIG. 2B of the vibrator element. FIG. 3D is a plan view of a second main surface side of the circuit substrate for an electronic device.

First, the circuit substrate for an electronic device according to Embodiment 1 will be described.

As illustrated in FIG. 1A, a circuit substrate for an electronic device 100 includes a mount pad 2, a mount pad 3, a drawn wire 4 drawn out from the mount pad 2, and a drawn wire 5 drawn out from the mount pad 3 disposed on a first main surface of a rectangular (also including substantially rectangular) insulating substrate 1 made of a ceramic or the like.

Furthermore, as illustrated in FIG. 1D, a first conductive pattern 6, a second conductive pattern 7, and third conductive patterns 8 are disposed on a second main surface of the insulating substrate 1. In addition, the first conductive pattern 6 has a greater area than the second conductive pattern 7.

The first conductive pattern 6, the second conductive pattern 7, and the third conductive patterns 8 are insulated from each other, and are not electrically connected to each other through drawn wires that may be short-circuited to each other.

In addition, the first conductive pattern 6 and the second conductive pattern 7 are arrayed in a row along one side of the second main surface.

On the second main surface, a center point H present between the first conductive pattern 6 and the second conductive pattern 7 is disposed on a second conductive pattern 7 side of a center line G-G that intersects the direction in which the first conductive pattern 6 and the second conductive pattern 7 are arrayed.

The first conductive pattern 6 is interposed two third conductive patterns 8 that are arrayed along the center line G-G, and has a shape that protrudes toward the center line G-G more than the third conductive patterns 8 (the first conductive pattern 6 is closer to the center line G-G than the third conductive patterns 8).

The drawn wire 4 and the second conductive pattern 7 are electrically connected to each other through a drawn wire 9 that is disposed along the thickness direction of the insulating substrate 1.

The drawn wire 5 and the first conductive pattern 6 are electrically connected to each other through a drawn wire 10 that is disposed along the thickness direction of the insulating substrate 1.

Next, a vibrator element according to Embodiment 1 will be described.

Any oscillator including two electrodes with different polarities such as a MEMS oscillator, a gyro vibrator element, or a tuning fork vibrator element can be applied as the vibrator element. In the present exemplary embodiment, a piezoelectric vibration-type vibrator element 200 will be described.

As illustrated in FIG. 2D, the vibrator element 200 includes a vibrator element substrate 20, and is made of an AT cut quartz crystal plate. A first electrode pattern 21 is disposed on a first surface (one surface) of the vibrator element substrate 20. Meanwhile, as the vibrator element substrate 20, being not limited to the AT cut quartz crystal plate, the AT cut quartz crystal plate, an SC cut quartz crystal plate, a piezoelectric crystalline body, or the like may be used.

The first electrode pattern 21 is constituted of a first layer made of a nickel or chromium layer, or an alloy including nickel or chromium, a second layer made of gold, silver, or an alloy including gold or silver on a surface thereof, and the like, and includes an electrode for excitation 22 for driving the vibrator element substrate 20 and a drawn pattern 23 extending from the electrode for excitation 22 toward the exterior edge of the vibrator element substrate 20.

As illustrated in FIG. 2B, if necessary, the drawn pattern 23 may extend from one surface to the other main surface through a side surface of the vibrator element substrate 20.

Furthermore, as illustrated in FIG. 2A, the vibrator element 200 includes a second electrode pattern 24 disposed on a second surface (the other surface) that is the back surface of the first surface of the vibrator element substrate 20.

The second electrode pattern 24 is constituted of a first layer made of a nickel or chromium layer, or an alloy including nickel or chromium, a second layer made of gold, silver, or an alloy including gold or silver on a surface thereof, and the like, and includes an electrode for excitation 25 for driving the vibrator element substrate 20 and a drawn pattern 26 extending from the electrode for excitation 25 toward the exterior edge of the vibrator element substrate 20.

Meanwhile, as illustrated in FIG. 2C, if necessary, the drawn pattern 26 may extend from the other surface to one main surface through the side surface of the vibrator element substrate 20.

As illustrated in FIG. 2A, the vibrator element 200 has a rectangular structure with curved corners, but may have a rectangular structure with a different corner shape. Additionally, in addition to the rectangular shape, the structure may have, for example, a round shape, an ellipsoidal shape, an oval shape, or a polygonal shape (including polygonal shapes with curved corners).

Furthermore, the vibrator element 200 has a flat shape all over both surfaces of the vibrator element substrate 20, but may also have a convex shape in which at least any one surface curves upward, a bevel shape in which the exterior edge of at least any one surface slopes, a mesa shape in which a region on at least any one surface in which the surface is overlapped by the electrodes for excitation 22 and 25 stands out, or a combination of the above-described shapes.

Next, an electronic device according to Embodiment 1 will be described.

An electronic device illustrated in FIGS. 3A to 3D includes the vibrator element 200 mounted on the circuit substrate for an electronic device 100.

That is, in the electronic device 300, the vibrator element 200 is disposed on the circuit substrate for an electronic device 100 in a state in which one surface of the vibrator element 200 faces the first main surface side of the insulating substrate 1, furthermore, if necessary, the vibrator element 200 is covered with a lid (not illustrated), the lid is disposed on the first main surface side of the insulating substrate 1, and a space for accommodating the vibrator element 200 is formed between the lid and the circuit substrate for an electronic device 100.

As illustrated in FIGS. 3A and 3B, the drawn pattern 26 and the mount pad 2 are connected to each other through a joining member 30 such as a conductive adhesive or a metal bump, whereby the second electrode pattern 24 and the second conductive pattern 7 are electrically connected to each other, and the vibrator element 200 is secured and supported by the circuit substrate for an electronic device 100 through the joining member 30 in a cantilevered state.

Furthermore, as illustrated in FIG. 3C, in the vibrator element 200, the drawn pattern 23 and the mount pad 3 are connected to each other through a joining member 31 such as a conductive adhesive or a metal bump, whereby the first electrode pattern 21 and the first conductive pattern 6 are electrically connected to each other.

The positional relationship between the circuit substrate for an electronic device 100 and the first electrode pattern 21 will be described.

FIG. 3D is a plan view of the circuit substrate for an electronic device 100 seen from the second main surface side, in which the outline of the first electrode pattern 21 is indicated using a dotted line (perspective view).

As illustrated in the same drawing, the first conductive pattern 6 includes a first section 32 in which the first conductive pattern overlaps the first electrode pattern 21.

The second conductive pattern 7 includes a second section 33 in which the second conductive pattern overlaps the first electrode pattern 21 and which has an area of 0 or more (the area of the second section 33≥0), and, for example, the area of the first section 32 is desirably equal to or greater than 1.5 times the area of the second section.

Furthermore, the third conductive patterns 8 include a third section 34 in which the third conductive patterns overlap the first electrode pattern 21 and which has an area of 0 or more (the area of the third section 34≥0).

In addition, the area of the first section 32 is greater than the area of the second section 33 (the area of the first section 32> the area of the second section 33), whereby it is possible to suppress the total value of the parasitic capacitance between the first electrode pattern 21 and the first conductive pattern 6 and the second conductive pattern 7.

That is, the first conductive pattern 6 and the first electrode pattern 21 are in an electrically conductive state (for example, a short-circuit state), and thus are at the same potential.

Therefore, the potential difference between the first conductive pattern 6 and the first electrode pattern 21 reaches substantially zero, and therefore parasitic capacitance therebetween is not easily generated even when the insulating substrate 1 having a high dielectric constant is interposed.

Therefore, as the area of the first section 32 increases, the value of the parasitic capacitance generated at the first electrode pattern 21 can be expected to decrease.

On the other hand, the second conductive pattern 7 and the first electrode pattern 21 are substantially in an electrically insulating state (high impedance state), and therefore parasitic capacitance is easily generated, and, as the value of the parasitic capacitance increases, the value of the equivalent parallel capacitance $C_0$ of the vibrator element 200 increases.

Therefore, as the area of the second section 33 decreases, the value of the parasitic capacitance generated in the first electrode pattern 21 can decrease.

Therefore, when the relationship of the area of the first section 32> the area of the second section 33 is set, the total value of the parasitic capacitance between the first electrode pattern 21 and the first conductive pattern 6 and the second conductive pattern 7 can be suppressed using the synergetic effect.

In addition, the area of the third section 34 is also desirably smaller than the area of the first section 32.

As the area of the third section 34 decreases, the parasitic capacitance between the first electrode pattern 21 and the third conductive pattern 8 can decrease to a small value.

Particularly, in a case in which the third section 34 is present on the free end side (the end side on the opposite side to the joining member 30 or 31 side) of the vibrator element 200 of the first conductive pattern 6 or the second conductive pattern 7 illustrated in FIG. 3D, it is desirable to set the area of the first section 32> the area of the second section 33> the area of the third section 34≥0.

That is, in a case in which a shock is applied to the electronic device 300, the fluctuation width increases toward the free end side of the joining member 30 or 31, and, as the fluctuation width increases, the change in the value of the parasitic capacitance is also likely to increase.

Therefore, it is desirable to decrease the area of the third section 34 in the third conductive pattern 8 located closer to the free end side than the first conductive pattern 6 and the second conductive pattern 7, and to suppress the change width of the value of the parasitic capacitance generated in the first electrode pattern 21 at a small level.

Particularly, in a case in which the output signal of an oscillator or the like is output from the third conductive pattern 8, there is a concern that the output signal may be input to the vibrator element 200 as noise through the parasitic capacitance, and abnormal oscillation be easily caused.

Therefore, even in the above-described constitution, the invention is effective for reducing abnormal oscillation.

In addition, the invention is effective in a case in which, in the insulating substrate 1, at least a place overlapping the first section has a single layer structure.

That is, when the insulating substrate has a laminate structure, the problem can be considered to be solved solely by a constitution in which a metal pattern for shielding earthed between laminated layers is disposed; however, in a case in which the insulating substrate 1 is a single layer, there are no laminated layers between which the metal pattern for shielding is disposed, and thus it is difficult to carry out a countermeasure such as the above-described laminate structure.

Figure 4:
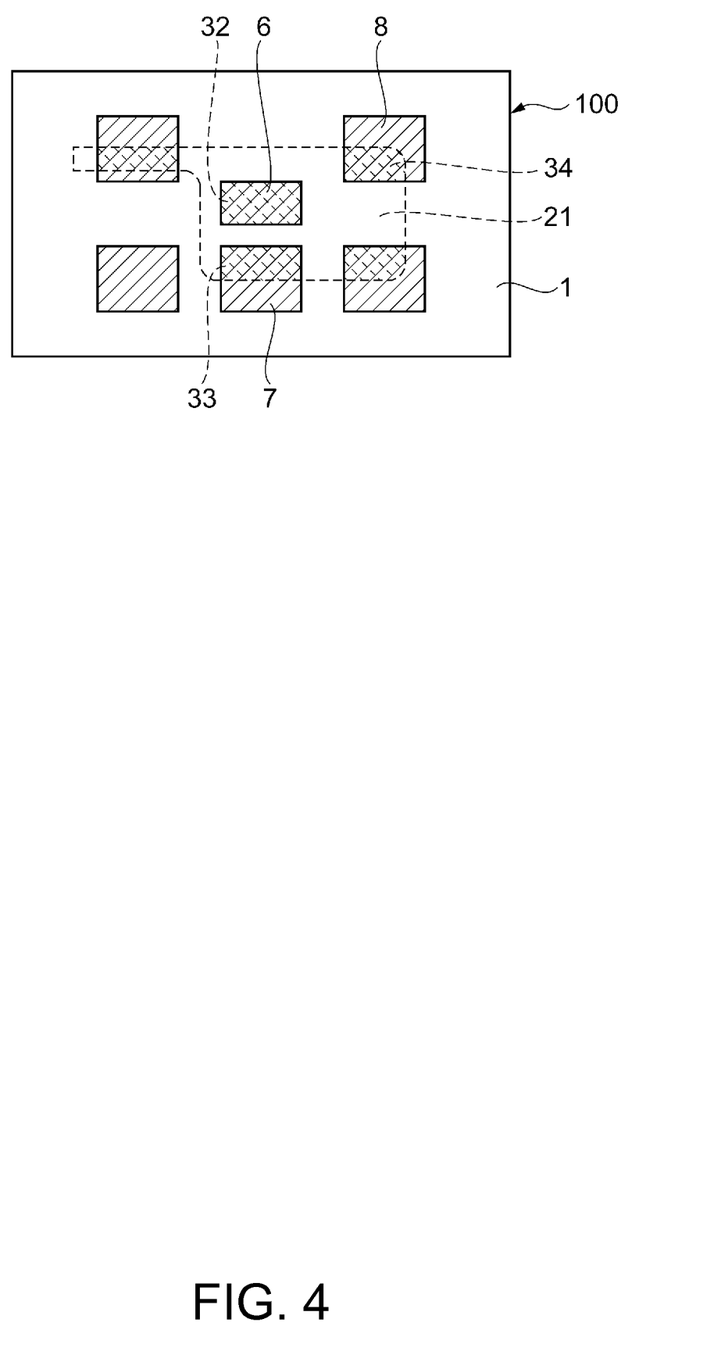
FIG. 4 is a view of the circuit substrate for an electronic device according to Embodiment 1.

FIG. 4 illustrates another application example of Embodiment 1, and is a plan view of the second main surface of the circuit substrate for an electronic device 100, in which the outline of the first electrode pattern 21 in the mounted vibrator element 200 is indicated using a dotted line (perspective view).

The circuit substrate for an electronic device 100 illustrated in FIG. 4 is different from the circuit substrate for an electronic device 100 illustrated in FIGS. 1A to 1D in that the first conductive pattern 6 and the second conductive pattern 7 have substantially the same areas.

As illustrated in the same drawing, in the case of the present application example, the entire surface of the first conductive pattern 6 overlaps the first electrode pattern 21.

The second conductive pattern 7 includes the second section 33 in which the second conductive pattern overlaps the first electrode pattern 21 and which has an area of 0 or more (the area of the second section 33≥0).

Furthermore, the third conductive patterns 8 include the third section 34 in which the third conductive patterns overlap the first electrode pattern 21 and which has an area of 0 or more (the area of the third section 34≥0).

As described above, according to the electronic device of the exemplary embodiment, it is possible to obtain the following effects.

In the first section 32, the first electrode pattern 21 and the first conductive pattern 6 overlapping the first electrode pattern 21 are electrically connected to each other, and thus are at the same potential. In addition, the area of the first section 32 is greater than the area in which the first electrode pattern 21 and the second conductive pattern 7 overlap each other. Therefore, the proportion of a region in the first electrode pattern 21 in which the parasitic capacitance is not easily generated increases, and therefore the electrical characteristics of the electronic device can be improved.

Embodiment 2

Figure 5A:
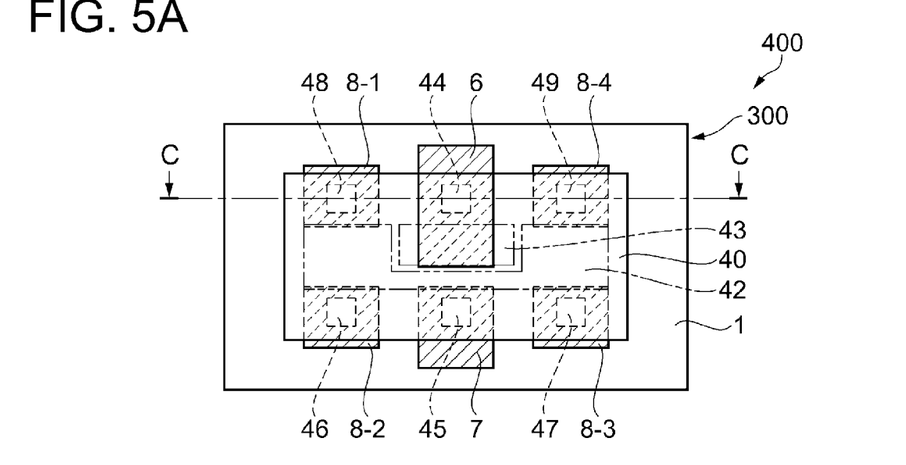
FIGS. 5A to 5C are views of an electronic device and views of an electronic component according to Embodiment 2.
Figure 5B:
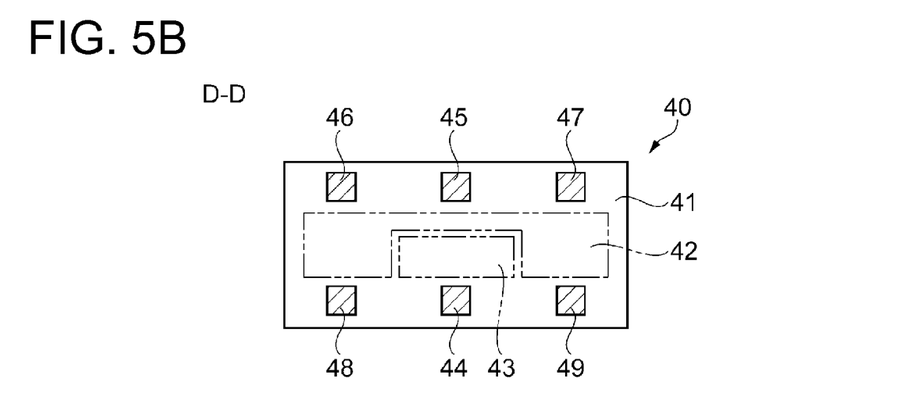
Figure 5C:
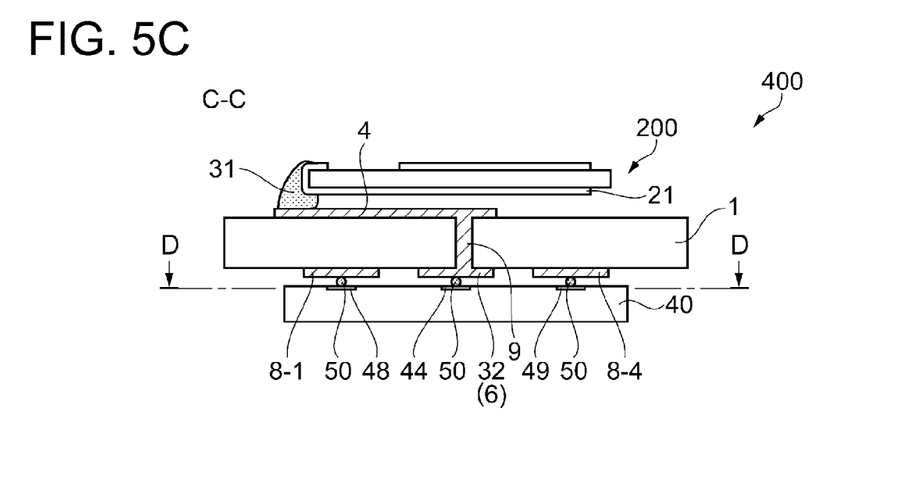
Figure 6A:
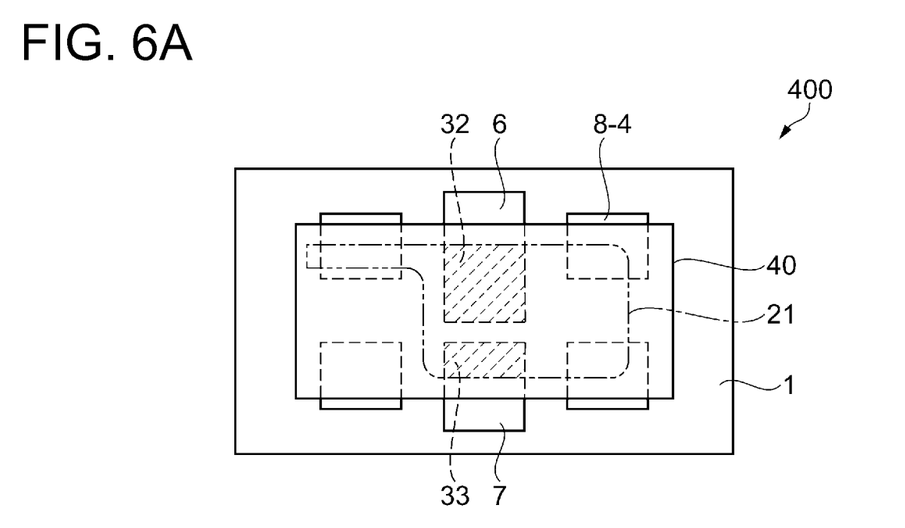
FIGS. 6A and 6B are views of the electronic device according to Embodiment 2.
Figure 6B:
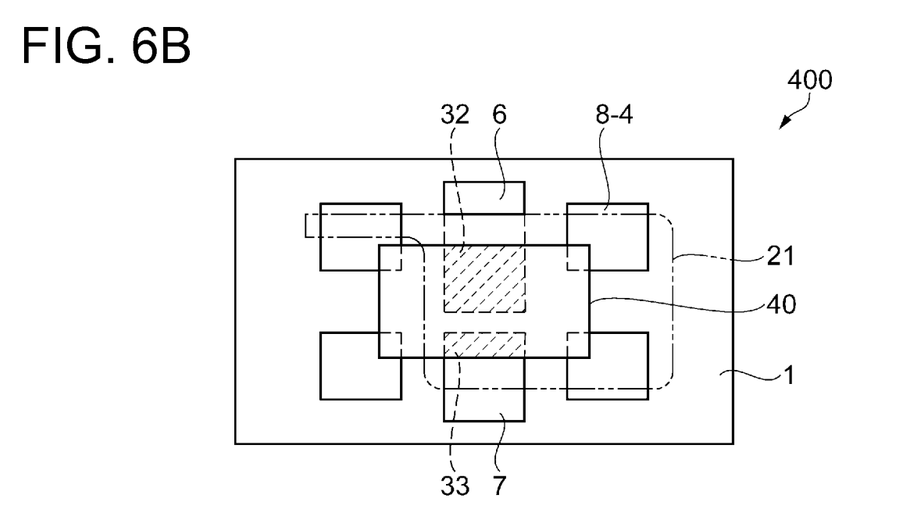

FIGS. 5A to 5C are plan views of an electronic device and an electronic component according to Embodiment 2 on a circuit disposition surface side, FIG. 5A is a plan view of the electronic device seen from the second main surface side of the circuit substrate for an electronic device 100, FIG. 5B is a plan view of the electronic component seen from D-D in FIG. 5C, and FIG. 5C is a cross-sectional view of the electronic device. FIGS. 6A and 6B are perspective views of the electronic device illustrated in FIGS. 5A to 5C, FIG. 6A is a view of a case in which the area in which the first conductive pattern 6 or the second conductive pattern 7 overlaps the electronic component 40 is greater than the area in which the first conductive pattern 6 or the second conductive pattern 7 overlaps the first electrode pattern 21, and FIG. 6B is a view of a case in which the area in which the first conductive pattern 6 or the second conductive pattern 7 overlaps the electronic component 40 is smaller than the area in which the first conductive pattern 6 or the second conductive pattern 7 overlaps the first electrode pattern 21.

The electronic device according to the present exemplary embodiment will be described with reference to the above-described drawings. Components similar to the components in Embodiment 1 will be given similar reference signs, and description thereof will not be made.

An electronic device that will be described in Embodiment 2 is, for example, a piezoelectric oscillator.

As illustrated in FIG. 5A, an electronic device 400 further includes an electronic component 40 that is an integrated circuit component (IC chip) on the electronic device 300 illustrated in FIGS. 3A to 3D.

As illustrated in FIG. 5B, the electronic component 40 is constituted of an analog circuit 42 and a digital circuit 43 that are provided on the main surface side of a silicon substrate 41 as integrated circuits, and also includes mount pads 44, 45, 46, 47, 48, and 49.

The analog circuit 42 includes components necessary for functions required for the electronic device 400 among circuits such as an amplifier circuit for oscillation for driving the vibrator element 200, if necessary, a temperature compensated circuit for compensating for the temperature features of electrical performance of the vibrator element 200, and an overheating element for heating the vibrator element 200.

The digital circuit 43 includes a memory circuit such as an erasable programmable read only memory (EPROM) or an electrically erasable programmable read only memory (EEPROM) or, if necessary, a computation circuit.

The digital circuit 43 is disposed between the mount pad 44 and the mount pad 45 so that the mount pad 44 and the digital circuit 43 are placed next to each other.

Meanwhile, in the case of the exemplary embodiment, the analog circuit 42 and the digital circuit 43 are disposed side by side in the direction in which the mount pad 44 and the mount pad 45 are arrayed.

An output wire of the amplifier circuit and the mount pad 49 are connected to each other through a conductor path formed in the silicon substrate 41 so that an output signal of the amplifier circuit is supplied to the mount pad 44 in the analog circuit 42.

An input wire of the amplifier circuit and the mount pad 45 are connected to each other through the conductor path formed in the silicon substrate 41 so that an input signal is supplied to the amplifier circuit from the mount pad 45 in the analog circuit 42.

A constant power supply circuit and the mount pad 46 are connected to each other through the conductor path formed in the silicon substrate 41, and a circuit for earth connection and the mount pad 47 are connected to each other through the conductor path formed in the silicon substrate 41 so that power can be supplied to the constant power supply circuit through the mount pad 46 in the analog circuit 42.

The mount pad 48 is a component used as a terminal for inputting an electrical signal such as a direct voltage to the analog circuit 42 as necessary, a control signal and a data signal to the digital circuit 43, and the mount pad is connected to the analog circuit 42 and the digital circuit 43 through the conductor path formed in the silicon substrate 41 so that these uses can be achieved.

Furthermore, the analog circuit 42 and the mount pad 49 are connected to each other through the conductor path formed in the silicon substrate 41 so that an oscillation signal from the analog circuit 42 is outputted from the mount pad 49 as an output signal of the oscillator.

In addition, as illustrated in FIG. 5A, in a state in which the electronic component 40 is mounted on the second main surface side of the circuit substrate for an electronic device 100, the mount pad 44 overlaps the first conductive pattern 6, the mount pad 45 overlaps the second conductive pattern 7, and the mount pads 45 to 49 are disposed on the silicon substrate 41 so as to overlap a third conductive pattern 8-1, a third conductive pattern 8-2, a third conductive pattern 8-3, and a third conductive pattern 8-4 respectively.

Meanwhile, in the case of the exemplary embodiment, the mount pad 44 is fit into a range of the region of the first section 32 as illustrated in, for example, FIG. 5A.

The electronic component 40 and the circuit substrate for an electronic device 100 are connected to each other through metal bumps 50 as illustrated in FIG. 5C.

That is, the electronic component 40 is flip-chip-bonded to the circuit substrate for an electronic device 100 with the main surface on which the integrated circuit is formed facing the circuit substrate for an electronic device 100.

Since the first conductive pattern 6 is a terminal for an analog signal, when the area of a section in which the first conductive pattern 6 overlaps the digital circuit 43 and the area of a section in which the first conductive pattern overlaps the analog circuit 42 are compared with each other in a region in which the first conductive pattern 6 does not overlap the mount pad 44, the area of the section in which the first conductive pattern 6 overlaps the digital circuit 43 is desirably greater (the area of the section in which the first conductive pattern 6 overlaps the analog circuit 42 is smaller), as illustrated in FIG. 5A.

This is intended to prevent the combining of analog signals between the first conductive pattern 6 and the analog circuit 42 and the consequent abnormal oscillation.

When the circuit overlapping the first conductive pattern 6 is the digital circuit 43, there is only a small concern that the digital circuit 43 may malfunction even when an analog signal emitted from the first conductive pattern 6 is transmitted to the digital circuit 43, and therefore the reliability as the electronic device 400 improves.

FIGS. 6A and 6B are plan views of the above-described electronic device 400 seen from the electronic component 40 side, and are views describing sections in which the first conductive pattern 6 or the second conductive pattern 7 overlaps the first electrode pattern 21 and the electronic component 40 (the first section 32 and the second section 33).

That is, the hatched regions illustrated in FIGS. 6A and 6B correspond to the first section 32 and the second section 33.

According to the above-described constitution, the same effects as Embodiment 1 can be expected.

In this case, the second section 33 easily becomes smaller in the constitution of FIG. 6B than in the constitution of FIG. 6A, and therefore the combining path of noise signals between the electronic component 40 and the second conductive pattern 7 is limited to being narrow.

Furthermore, in the exemplary embodiment, the second conductive pattern 7 is connected to an input wire of the amplifier circuit through the mount pad 45.

In the amplifier circuit in the electronic device 300 such as a piezoelectric oscillator, the electrical characteristics such as the oscillation frequency with respect to the capacitance change are likely to change more at the input terminal of the amplifier circuit than at the output terminal.

Therefore, when the second conductive pattern 7 in which the variation or change of the parasitic capacitance between individual bodies is small is connected to the input wire of the amplifier circuit, the electrical characteristics of the electronic device 300 becomes excellent.

Figure 7:
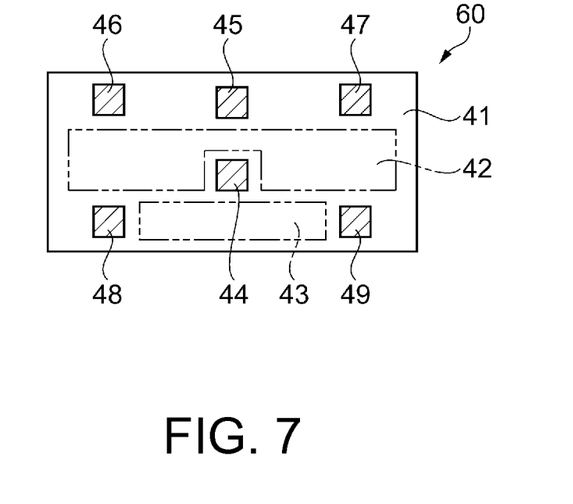
FIG. 7 is a view of the electronic component according to Embodiment 2.

FIG. 7 illustrates another example of the electronic component in Embodiment 2, and is a view seen from the same direction as in FIG. 5B.

In the electronic component 60 illustrated in FIG. 7, the mount pad 44 is disposed between the digital circuit 43 and the analog circuit 42.

In the above-described electronic component 60, since the distance between the analog circuit 42 and the mount pad 44 is short, it is possible to shorten the length of the conductor path connecting the analog circuit 42 and the mount pad 44, and to wire the conductor path while avoiding the overlapping of the conductor path and the digital circuit 43.

In addition, in the exemplary embodiment as well, similar to Embodiment 1, the area of the third section 34 is desirably smaller than the area of the first section 32.

As the area of the third section 34 decreases, it is possible to reduce the parasitic capacitance between the first electrode pattern 21 and the third conductive pattern 8-1 to the third conductive pattern 8-4.

Particularly, in a case in which the third section 34 in relation to the third conductive pattern 8-4 is present on the free end side (the end side on the opposite side to the joining member 30 or 31 side) of the vibrator element 200 of the first conductive pattern 6 or the second conductive pattern 7 illustrated in FIG. 3D, it is desirable to set the area of the first section 32> the area of the second section 33≥ the area of the third section 34 according to the third conductive pattern 8-4≥0.

That is, in a case in which a shock is applied to the electronic device 300, the fluctuation width increases toward the free end side of the joining member 30 or 31, and, as the fluctuation width increases, the change in the value of the parasitic capacitance is also likely to increase.

Therefore, it is desirable to decrease the area of the third section 34 in the third conductive pattern 8-4 located closer to the free end side than the first conductive pattern 6 and the second conductive pattern 7, and to suppress the change width of the value of the parasitic capacitance generated in the first electrode pattern 21 at a small level.

Particularly, in a case in which the output signal of an oscillator or the like is output from the third conductive pattern 8-4, there is a concern that the output signal may be input to the vibrator element 200 as noise through the parasitic capacitance, and abnormal oscillation be easily caused.

Therefore, even in the above-described constitution, the invention is effective for reducing abnormal oscillation.

The invention is not limited to the above-described exemplary embodiment, and it is possible to add a variety of modifications, improvements, and the like to the above-described exemplary embodiment. Modification Examples will be described below.

Modification Example 1

Figure 8:
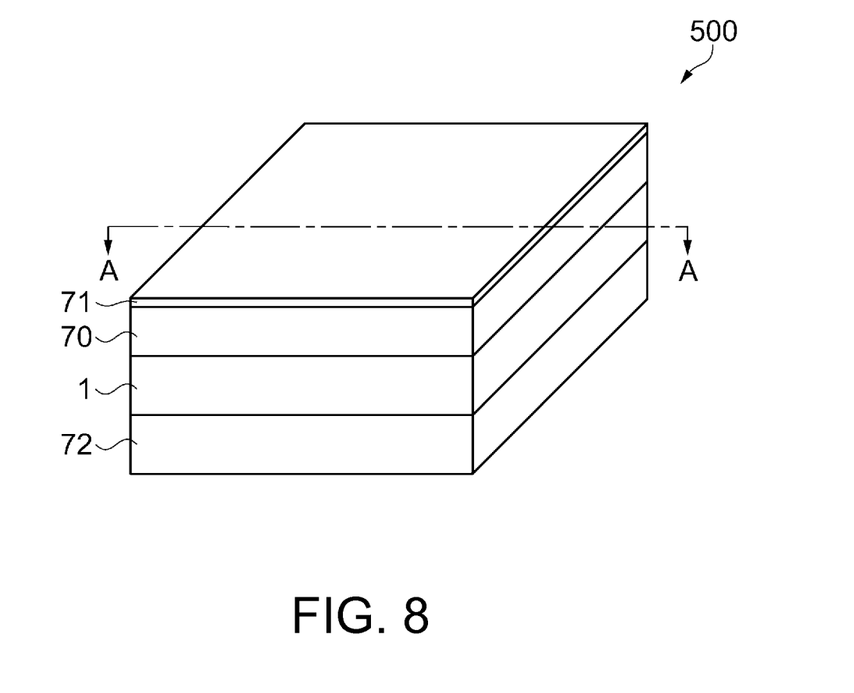
FIG. 8 is a view illustrating Modification Example 1 of the electronic device.
Figure 9A:
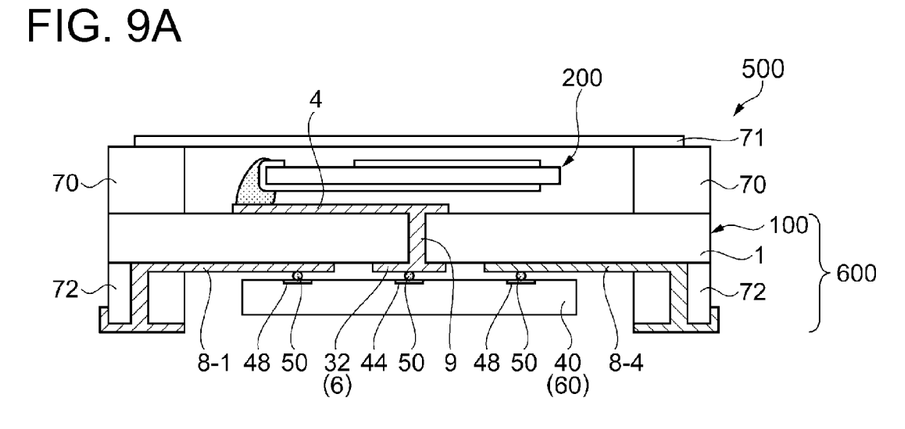
FIGS. 9A and 9B are views illustrating Modification Example 1 of the electronic device.

FIG. 8 is a perspective view of an electronic device according to Modification Example 1. FIG. 9A is a cross-sectional view of the electronic device illustrated in FIG. 8 taken along the line A-A, and FIG. 9B is a plan view of the electronic device illustrated in FIG. 8 seen from a mounting terminal.

In Embodiments 1 and 2, the electronic device has been described without illustrating additionally added constituent elements to clarify the features of the invention, but the invention is not limited to these constitutions.

Hereinafter, an electronic device 500 according to Modification Example 1 will be described. Components similar to the components in Embodiments 1 and 2 will be given similar reference signs, and description thereof will not be made.

Figure 9B:
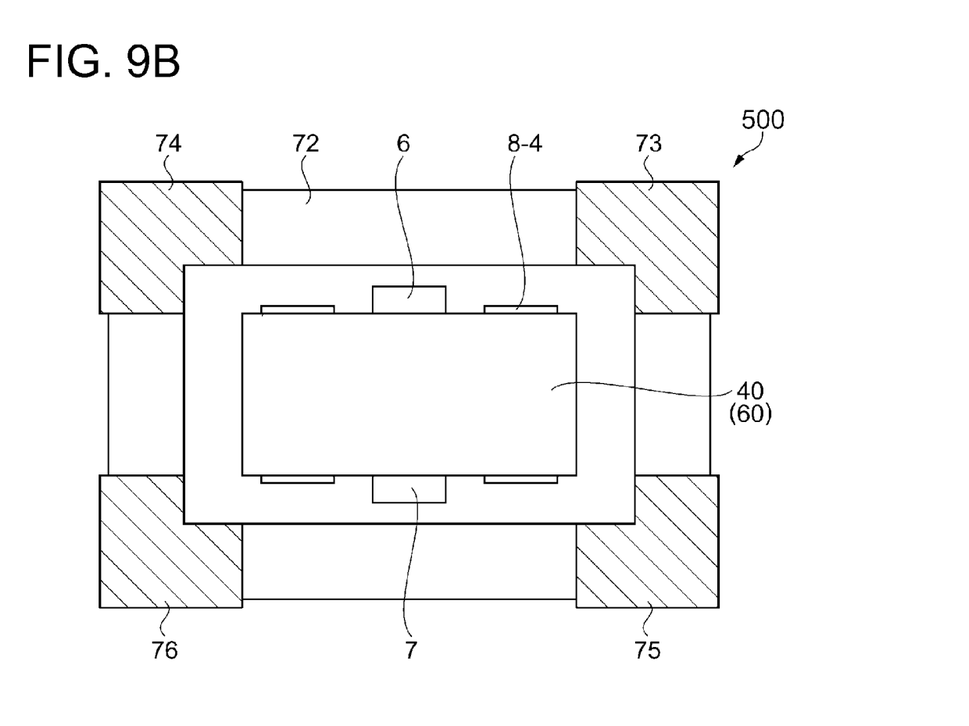

As illustrated in FIGS. 8, 9A, and 9B, an electronic device 500 includes a first frame body 70 disposed on the first main surface side of the insulating substrate 1 in the circuit substrate for an electronic device 100 so as to surround the vibrator element 200, and further includes a lid body 71 that shields the opening of the first frame body 70 and forms an accommodation space for the vibrator element 200 together with the circuit substrate for an electronic device 100 and the first frame body 70 and a second frame body 72 that is disposed on the second main surface side of the insulating substrate 1 so as to surround the electronic component 40 or the electronic component 60.

In addition, a constitution including at least the circuit substrate for an electronic device 100 and the second frame body 72 is considered as a package for an electronic device 600.

As illustrated in FIG. 9B, a plurality of a mounting terminal 73 to a mounting terminal 76 is disposed on the mounting surface side of the second frame body 72.

Regarding the mounting terminal 73 to the mounting terminal 76, for example, the mounting terminal 73 is electrically connected to the mount pad 49, the mounting terminal 74 is electrically connected to the mount pad 48, the mounting terminal 75 is electrically connected to the mount pad 47, and the mounting terminal 76 is electrically connected to the mount pad 46.

Meanwhile, the mount pad 47 may be electrically connected to the lid body 71, the first frame body 70 may be constituted of an insulating material such as a ceramic, or may be constituted of a solid metal blank such as a seam ring.

In addition, the invention of the present application more effectively functions in the case of a mesa-type vibrator element 200.

That is, in the case of the mesa-type vibrator element 200 having a surface that stands out, the surface becomes closer to the first conductive pattern 6, the second conductive pattern 7, and the third conductive pattern by as much as the surface stands out, and therefore a large parasitic capacitance is, accordingly, easily generated.

In addition, in the case of the circuit substrate for an electronic device 100 and the package for an electronic device 600 including the same, a constitution in which one parasitic capacitance is actively decreased by providing a difference in the parasitic capacitance between the first conductive pattern 6 and the second conductive pattern 7 that are connected to the vibrator element 200 is provided.

Therefore, in a case in which there is a difference between the acceptable range of the parasitic capacitance given to the input terminal and the acceptable range of the parasitic capacitance given to the output terminal of the electronic component 40 or the electronic component 60 to be connected, there is an advantage that any one of the first conductive pattern 6 and the second conductive pattern 7 having a smaller parasitic capacitance can be selected and connected to a terminal having a smaller acceptable range.

Meanwhile, if necessary, the first conductive pattern 6 and the second conductive pattern 7 can be used as a monitor terminal with which a measurement terminal for inspection is brought into contact when the electrical characteristics of the vibrator element 200, for example, the oscillation frequency are inspected.

In this case, at least one of the first conductive pattern 6 and the second conductive pattern 7 is used not only as the mount pad with which the metal bumps 50 are connected but also as the monitor terminal, or is divided into a mount pad region and a monitor terminal region.

Electronic Apparatus

Next, an electronic apparatus to which the electronic device 300, 400, or 500 according to the exemplary embodiment of the invention is applied will be described in detail on the basis of FIGS. 10 to 13. In the following description, an example in which the electronic device 500 is used will be described.

Figure 10:
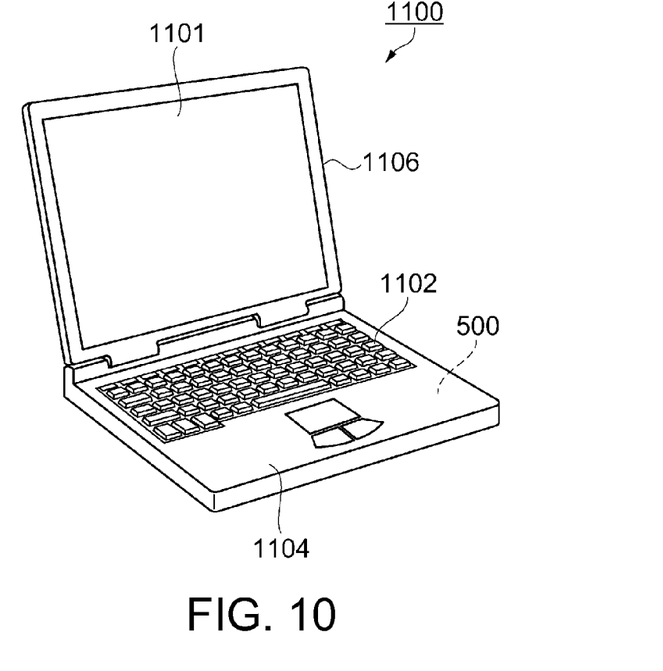
FIG. 10 is a perspective view illustrating a constitution of a mobile (or notebook) personal computer as an electronic apparatus including the electronic device according to the invention.

FIG. 10 is a perspective view illustrating the constitution of a mobile (or notebook) personal computer as an electronic apparatus including the electronic device according to the exemplary embodiment of the invention. In this drawing, a personal computer 1100 is constituted of a main body section 1104 including a keyboard 1102 and a display unit 1106 including a display section 1101, and the display unit 1106 is supported by the main body section 1104 through a hinge structure section so as to be capable of turning. Into the personal computer 1100 as described above, the electronic device 500 is built.

Figure 11:
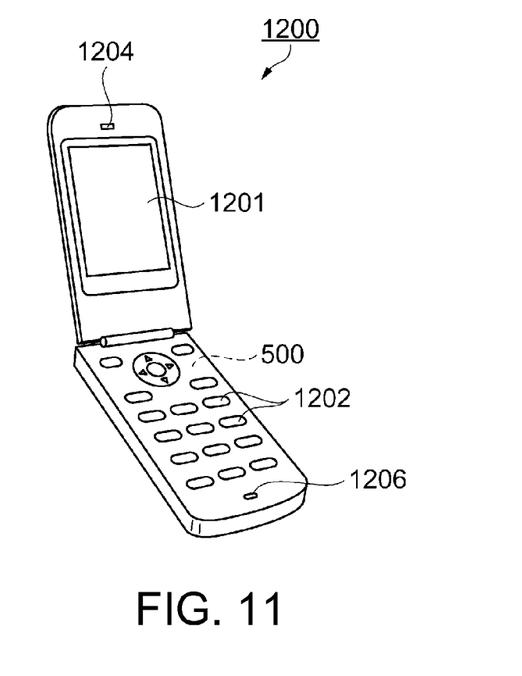
FIG. 11 is a perspective view illustrating a constitution of a mobile phone (also including PHS) as an electronic apparatus including the electronic device according to the invention.

FIG. 11 is a perspective view illustrating the constitution of a mobile phone (also including PHS) as an electronic apparatus including the electronic device according to the exemplary embodiment of the invention. In this drawing, a mobile phone 1200 includes a plurality of operation buttons 1202, an earpiece 1204 and a mouthpiece 1206, and a display section 1201 is disposed between the operation buttons 1202 and the earpiece 1204. Into the mobile phone 1200 described above, the electronic device 500 is built.

Figure 12:
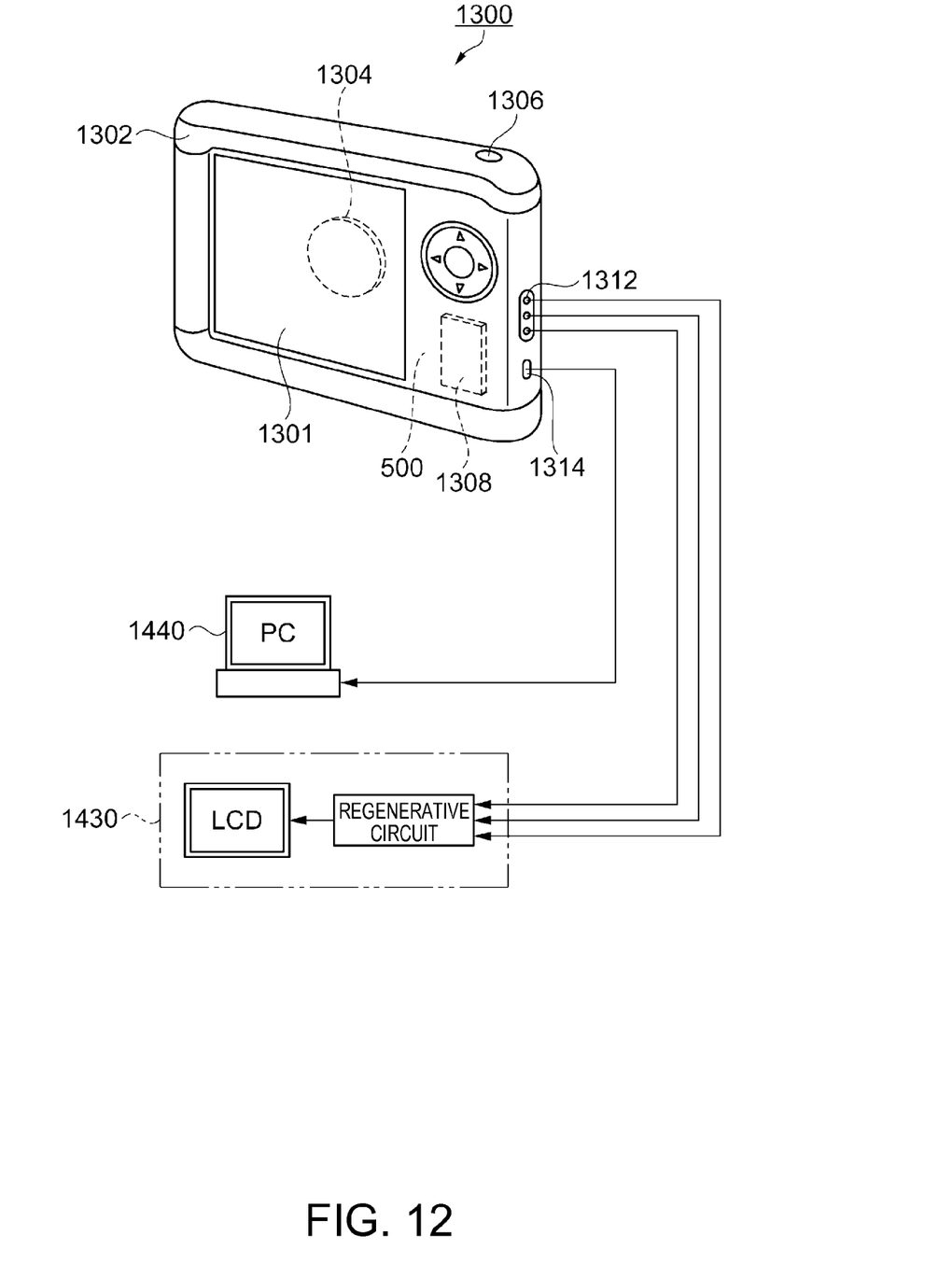
FIG. 12 is a perspective view illustrating a constitution of a digital camera as an electronic apparatus including the electronic device according to the invention.

FIG. 12 is a perspective view illustrating the constitution of a digital camera as an electronic apparatus including the electronic device according to the exemplary embodiment of the invention. In this drawing, the connection with external apparatuses is also simply illustrated. Here, while a film camera of the related art exposes a silver halide photographic film to an optical image of a subject, a digital camera 1300 converts an optical image of a subject in a photoelectric manner using an imaging element such as a charge coupled device (CCD), and generates an imaging signal (image signal).

A display section 1301 is provided on the back surface of a case (body) 1302 in the digital camera 1300, and displays an image on the basis of the imaging signal from the CCD. The display section 1301 functions as a finder that displays the subject in an electronic image form. In addition, a light-receiving unit 1304 including an optical lens (imaging optical system) or CCD is provided on the front surface side (the back surface side in the drawing) of the case 1302.

When a photographer confirms the subject image displayed on the display section 1301, and presses a shutter button 1306, the imaging signal from the CCD at this moment is transferred and stored in a memory 1308. In addition, in the digital camera 1300, a video signal output terminal 1312 and an input and output terminal for data communication 1314 are provided on the side surface of the case 1302. In addition, as illustrated in the drawing, if necessary, a television monitor 1430 is connected to the video signal output terminal 1312, and a personal computer (PC) 1440 is connected to the input and output terminal for data communication 1314 respectively. Furthermore, the imaging signal stored in the memory 1308 is outputted to the television monitor 1430 or the personal computer 1440 by a predetermined operation. Into the digital camera 1300 described above, the electronic device 500 is built.

Meanwhile, the electronic apparatus including the electronic device 500 according to the exemplary embodiment of the invention can be applied to, in addition to the personal computer 1100 in FIG. 10, the mobile phone 1200 of FIG. 11, and the digital camera 1300 of FIG. 12, for example, an ink jet-type ejection apparatus (for example, an inkjet printer), a laptop personal computer, a television, a video camera, a video recorder, a car navigation apparatus, a pager, an electronic notepad (including an electronic notepad equipped with a communication function), an electronic dictionary, a desktop calculator, an electronic game player, a word processor, a workstation, a television phone, a security television monitor, electronic binoculars, a POS terminal, a medical apparatus (for example, an electronic thermometer, a blood pressure gauge, a blood glucose gauge, an electrocardiogram measurement instrument, an ultrasonic diagnosis apparatus, or an electronic endoscope), a fish detector, a variety of measurement instruments, gauges (for example, gauges in a vehicle, an airplane, or a ship), a flight simulator, an instrument for a mobile communication base station, a storage area network instrument such as a router or a switch, a local area network instrument, a network transmission instrument, and the like.

Moving Object

Figure 13:
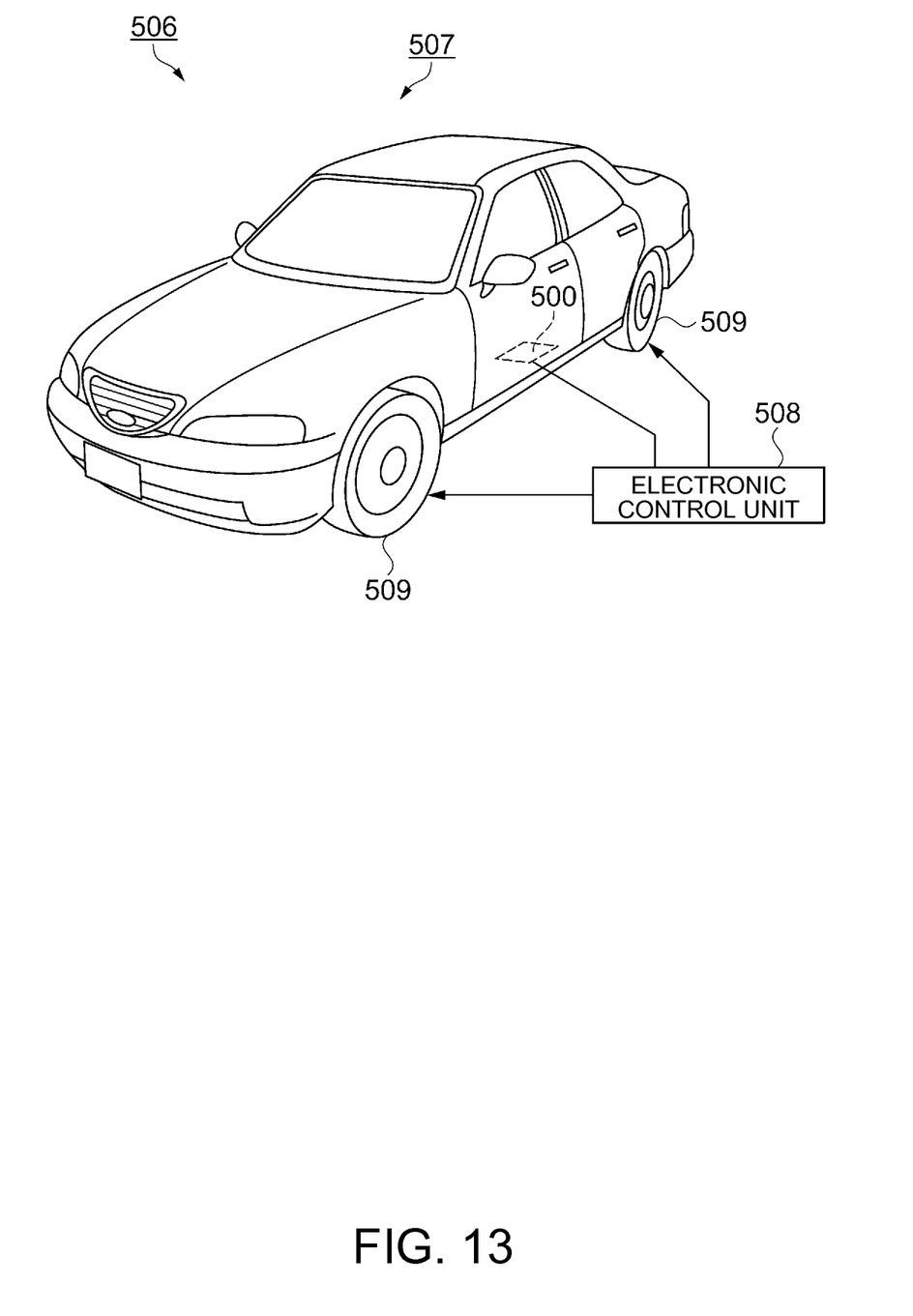
FIG. 13 is a perspective view illustrating a constitution of a vehicle as a moving object including the electronic device according to the invention.

FIG. 13 is a perspective view schematically illustrating the constitution of a vehicle as an example of a moving object. Into a vehicle 506, the electronic device 500 according to the exemplary embodiment of the invention is built. For example, as illustrated in FIG. 11, in the vehicle 506 as a moving object, an electronic control unit 508 that includes the electronic device 500 and controls wheels 509 and the like is mounted on a vehicle frame 507. In addition, the electronic device 500 according to the invention can be widely applied to, additionally, keyless entry, an immobilizer, a car navigation system, a car air conditioner, an antilock brake system (ABS), an air bag, a tire pressure monitoring system (TPMS), an engine controller, a battery monitor in a hybrid vehicle or an electric vehicle, and an electronic control unit (ECU) such as a vehicle position control system.

Thus far, the exemplary embodiments of the electronic device, electronic apparatus, and moving object according to the invention have been described on the basis of the drawings, but the invention is not limited to the above-described exemplary embodiments, and the constitutions of the respective sections can be substituted by an arbitrary constitution having similar functions. In addition, another arbitrary constituent material may be added to the invention.

In addition, the respective exemplary embodiments may be appropriately combined together.

The entire disclosure of Japanese Patent Application No. 2013-230947, filed Nov. 7, 2013 is expressly incorporated by reference herein.

What is claimed is:

1. An electronic device comprising:
an insulating substrate including a first main surface and a second main surface, which are in a front and back relationship;
a first conductive pattern and a second conductive pattern that are disposed on the second main surface;
a vibrator element that includes a vibrator element substrate, a first electrode pattern that is present on one surface of the vibrator element substrate, faces the first main surface, and is electrically connected to the first conductive pattern, and a second electrode pattern that is disposed on the other surface of the vibrator element substrate, the vibrator element being disposed on the first main surface; and
an electronic component that is overlapped by at least the first conductive pattern and is disposed on the second main surface,
wherein, in a plan view, the first conductive pattern includes a first section in which the first conductive pattern overlaps the first electrode pattern,
an area of the first section is greater than an area in which the second conductive pattern overlaps the first electrode pattern in a plan view,
the electronic component includes an analog circuit and a digital circuit, and
an area in which the first conductive pattern overlaps the digital circuit is greater than an area in which the first conductive pattern overlaps the analog circuit.

2. The electronic device according to claim 1,
wherein, in a plan view of the first section through the electronic component, the first section is covered with the electronic component, and
the area of the first section is greater than an area in which the second conductive pattern is overlapped by the first electrode pattern and the electronic component.

3. The electronic device according to claim 1,
wherein the insulating substrate has a single-layer structure at least in a place in which the insulating substrate overlaps the first section.

4. An electronic apparatus comprising:
the electronic device according to claim 1.

5. An electronic apparatus comprising:
the electronic device according to claim 2.

6. A moving object comprising:
the electronic device according to claim 1.

7. A moving object comprising:
the electronic device according to claim 2.

8. A circuit substrate for an electronic device, comprising:
an insulating substrate including a first main surface and a second main surface, which are in a front and back relationship;
a first conductive pattern and a second conductive pattern that are disposed on the second main surface, are electrically connected to a vibrator element disposed on the insulating substrate, and are electrically connected to an electronic component disposed on the second main surface,
wherein the first conductive pattern and the second conductive pattern are disposed in a region of the second main surface covered with the electronic component,
an area of the second conductive pattern is smaller than an area of the first conductive pattern,
the electronic component includes an analog circuit and a digital circuit, and
an area in which the first conductive pattern overlaps the digital circuit is greater than an area in which the first conductive pattern overlaps the analog circuit.

9. An electronic device comprising:
an insulating substrate including a first main surface and a second main surface that is opposite to the first main surface;
a first conductive pattern and a second conductive pattern that are disposed on the second main surface, wherein, in a plan view of the electronic device, the first conductive pattern and the second conductive pattern are located between third conductive patterns that are disposed on the second main surface;
a vibrator element disposed on the first main surface, the vibrator element including:
a vibrator element substrate,
a first electrode pattern that is located on one surface of the vibrator element substrate, faces the first main surface, and is electrically connected to the first conductive pattern, and
a second electrode pattern that is disposed on another surface of the vibrator element substrate;
a first drawn wire that is electrically connected to the first conductive pattern; and
a second drawn wire that is electrically connected to the second conductive pattern;
wherein, in the plan view, the first conductive pattern includes a first section that overlaps the first electrode pattern, and an area of the first section is greater than an area in which the second conductive pattern overlaps the first electrode pattern in the plan view, and
wherein the first conductive pattern and the second conductive pattern are arranged in a direction perpendicular to the first drawn wire and the second drawn wire.

10. An electronic device comprising:
an insulating substrate including a first main surface and a second main surface that is opposite to the first main surface, the insulating substrate having a width and a length that is greater than the width;
a first conductive pattern and a second conductive pattern that are disposed on the second main surface, wherein, in a plan view of the electronic device, the first conductive pattern and the second conductive pattern are located between third conductive patterns that are disposed on the second main surface; and
a vibrator element disposed on the first main surface, the vibrator element including:
a vibrator element substrate,
a first electrode pattern that is located on one surface of the vibrator element substrate, faces the first main surface, and is electrically connected to the first conductive pattern, and
a second electrode pattern that is disposed on another surface of the vibrator element substrate;
wherein, in the plan view, the first conductive pattern includes a first section that overlaps the first electrode pattern, and an area of the first section is greater than an area in which the second conductive pattern overlaps the first electrode pattern in the plan view, and
wherein the first conductive pattern and the second conductive pattern are arranged in a direction perpendicular to the length of the insulating substrate.

* * * * *